United States Patent [19]

Shimizu

[11] Patent Number: 5,189,674
[45] Date of Patent: Feb. 23, 1993

[54] FAULT LOCATING SYSTEM CAPABLE OF QUICKLY LOCATING A FAULT IN A HIERARCHICAL COMMUNICATION NETWORK

[75] Inventor: Hiroshi Shimizu, Tokyo, Japan
[73] Assignee: NEC Corporation, Tokyo, Japan
[21] Appl. No.: 550,830
[22] Filed: Jul. 11, 1990

[30] Foreign Application Priority Data

Jul. 11, 1989 [JP] Japan ............................. 1-179256
Aug. 8, 1989 [JP] Japan ............................. 1-206518

[51] Int. Cl.⁵ ........................................... G01R 31/28
[52] U.S. Cl. ................................. 371/20.1; 371/20.4; 371/25.1; 371/26
[58] Field of Search .................. 371/20.1, 20.4, 25.1, 371/26, 8.2, 11.2

[56] References Cited

U.S. PATENT DOCUMENTS

| 3,497,685 | 2/1970 | Stafford et al. | 371/26 |
| 4,709,366 | 11/1987 | Scott et al. | 371/26 |
| 4,719,625 | 1/1988 | Bell et al. | 371/11.2 |
| 4,872,165 | 10/1989 | Mori et al. | 371/11.2 |
| 5,046,034 | 9/1991 | Stark et al. | 364/580 |

FOREIGN PATENT DOCUMENTS 60-250745 12/1985 Japan .

OTHER PUBLICATIONS

Japanese Paper No. 1791, Imada et al., "Fault Discrimination Method for Supervision of Communication Network", 1987 National Convention of The Institute of Electronics, Information & Communication Engineers, Mar. 26-29, 1987.

*Primary Examiner*—Charles E. Atkinson
*Attorney, Agent, or Firm*—Foley & Lardner

[57] ABSTRACT

In a fault locating system for use in combination with a communication network of a hierarchy comprising a plurality of communication units which are divisible into a plurality of layers, each of the communication units produces, on occurrence of a fault, first, second, and third alarm signals Iu, Id, and Ou representative of interruption of an input signal from an upper communication unit, interruption of an input signal from a lower communication unit, and interruption of an output signal to an upper communication unit. A pattern of the first through the third alarm signals Iu to Ou is extracted from three specific communication units and is monitored to locate the fault. In order to locate multiple faults, the first through the third alarm signals are erased after a single fault is located to monitor whether or not alarm signals remain without an erasure. Similar operation is repeated until no alarm signal remain. The three specific communication units may be composed of a highest communication unit located at a highest layer in faulty communication units, a counterpart communication unit of the highest communication unit, and an upper communication unit of the counterpart communication unit.

7 Claims, 6 Drawing Sheets

FAULT LOCATING SYSTEM CAPABLE OF QUICKLY LOCATING A FAULT IN A HIERARCHICAL COMMUNICATION NETWORK

BACKGROUND OF THE INVENTION

This invention relates to a fault locating system which is used for locating a fault in a communication network which has a hierarchy and which is therefore divisible into a plurality of layers graded from an uppermost layer to a lowermost one.

Heretofore, a fault detection system is disclosed in Japanese Unexamined Patent Publication No. Syo 60-250745, namely, 250745/1985 and is applicable to a hierarchical communication network. With this previous structure, a wide variety of communication units are used in the hierarchical communication network and divided into a plurality of layers from an uppermost layer to a lowermost one. In such a communication network, each signal is multiplexed into a multiplexed signal in each communication unit except for the lowermost layer.

Now, when faults occur in communication units which may be called faulty communication units, alarm signals are produced from the faulty communication units. Such alarm signals are collected and coded into an alarm pattern which is composed of a plurality of bits and which may be represented by AP. In this event, each bit takes a logic "1" level and a logic "0" level when a fault occurs or does not, respectively.

Herein, it is assumed that zeroth through I-th communication units are placed at zeroth through I-th locations 0 to I in the communication system and are represented by $a_0$ to $a_I$, respectively. In this connection, an i-th communication unit is depicted as $a_i$. When a fault occurs in the i-th communication unit, the alarm signal is assumed to be represented by $b_i$. Under the circumstances, it is to be noted that the alarm pattern AP can be expressed by:

$$AP = b_I 2^I + b_{I-1} 2^{I-1} + \ldots + b_i 2^i + \ldots + b_1 2^1 + b_0,$$

where $b_i$ equals 0 and 1 in a normal state and in a faulty state, respectively.

Let a fault occur in a certain one of the communication units that is present in a certain layer in the communication network wherein a signal is multiplexed into the multiplexed signal determined by the hierarchy of the communication units. In this event, an alarm pattern is formed due to such a fault, as mentioned above. Moreover, an influence of such a fault is spread or repercussed from the certain layer to all the communication units connected to lower layers. This shows that the alarm signal is spread or repercussed over the lower layers to cause spread patterns to occur in the communication units connected to the lower layers. Hereinafter, such alarm and spread patterns which actually appear on occurrence of a fault will be collectively called actual alarm patterns.

In order to locate the fault in the conventional communication network spread patterns are previously memorized which will appear at each of points in the communication network when faults occur at the respective points. Such spread patterns may be referred to as forecast spread patterns and are successively compared with the actual alarm patterns to locate the fault or to specify each point of the fault.

With this structure, it is impossible to locate a fault when an actual alarm pattern is not coincident with any one of the forecast spread patterns. In addition, the forecast spread patterns vastly increase as the scale of the communication network becomes large. This necessitates an increase of a memory area for memorizing the forecast spread patterns. Moreover, a very long time is required to successively compare the actual alarm pattern with the forecast spread patterns and to locate the fault.

SUMMARY OF THE INVENTION

It is an object of this invention to provide a fault locating system which is capable of quickly locating a fault in a hierarchical communication network.

It is another object of this invention to provide a fault locating system of the type described, which is capable of reducing memory area required for memorizing forecast spread patterns.

It is still another object of this invention to provide a fault locating system of the type described, which can locate a fault even when the fault is spread over lower layers.

It is another object of this invention to provide a fault locating system of the type described, wherein multiple faults can be located.

A fault locating system of the present invention is for use in combination with a communication network which comprises a plurality of communication units structured in hierarchy and divisible into a plurality of layers graded from an uppermost layer to a lowermost one. The fault locating system is capable of locating a fault when the fault occurs in the communication network. Each of the communication units, when there is no fault, is supplied with first and second input signals from upper and lower ones of the layers in the hierarchy, respectively, and supplies an output signal upwards of the hierarchy. The communication units produce fault information signals representative of whether or not faults occur in the communication units. The communication units are rendered into faulty communication units on occurrence of the faults. Each of the fault information signals is classifiable into first, second, and third alarm signals. The first and the second alarm signals represent interruptions of the first and the second input signals while the third alarm signal represents an interruption of the output signal. According to this invention, the fault locating system comprises classification means supplied with the fault information signals from the communication units for classifying each of the fault information signals into the first through the third alarm signals, alarm signal memorizing means connected to the classification means for memorizing the first through the third alarm signals for every one of the communication units, judgment rule memorizing means for memorizing a predetermined judgment rule for locating the fault, and accessing means connected to the alarm signal memorizing means for accessing the alarm signal memorizing means on occurrence of the fault to extract first, second, and third extracted signals from the alarm signal memorizing means. The first extracted signal is specified by a selected one of the first and the third alarm signals sent from a first unit that is a highest one of the faulty communication units located at a highest one of the layer among the faulty communication units while the second extracted signal is specified by a remaining one of the first and the third alarm signals sent from a second unit that logically forms a counterpart communication unit of the first unit in the hierarchy. The third extracted signal is specified by the second alarm signal of a third unit that belongs to a physically higher layer relative to the first and the second units. The fault locating system further comprises judging means connected to the accessing means and the judgment rule memorizing means for judging the fault from the first through the third extracted signals in accordance with the predetermined judgment rule to locate the fault.

DESCRIPTION OF THE PREFERRED EMBODIMENTS: CONVENTIONAL COMMUNICATION NETWORK

Figure 1:
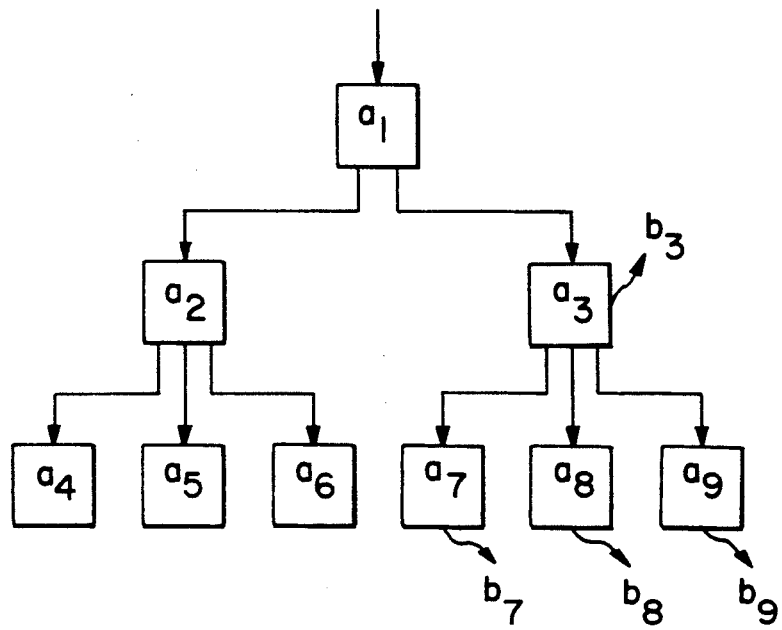
FIG. 1 is a block diagram of a communication network for use in describing a conventional fault locating system.

Referring to FIG. 1, a conventional communication network will be described for a better understanding of this invention. The illustrated communication network has a hierarchy which is divided into a multiple number of layers from a lowermost layer to an uppermost one. In the example being illustrated, the uppermost layer contains a first communication unit $a_1$ while a lower layer contains second and third communication units $a_2$ and $a_3$. Likewise, the lowermost layer contains fourth through ninth communication units $a_4$ to $a_9$. More specifically, the second, the fourth, the fifth, and the sixth communication units $a_2$, $a_4$, $a_5$, and $a_6$ form a first block while the third, the seventh, the eighth, and the ninth communication units $a_3$, $a_7$, $a_8$, and $a_9$ form a second block.

It is assumed that a fault is caused to occur at the third communication unit $a_3$ of the second block and, as a result, an alarm signal $b_3$ is produced from the third communication unit $a_3$. In this case, the seventh, the eighth, and the ninth communication units $a_7$, $a_8$, and $a_9$ are not supplied with any signal. Accordingly, the alarm signals are produced in the form of $b_7$, $b_8$, and $b_9$ from the seventh, the eighth, and the ninth communication units $a_7$, $a_8$, and $a_9$. Thus, an influence of the fault at the third communication unit $a_3$ is spread over the lower layers. In other words, the alarm signal of the third communication unit $a_3$ is spread over the lower communication units, such as $a_7$ through $a_9$, to provide spread alarm patterns.

In the conventional communication network, spread alarm patterns which result from faults occurring at fault points of the communication network are previously memorized in correspondence to the fault points and may be called forecast spread alarm patterns. An actual alarm pattern which appears on occurrence of a fault is successively compared with the forecast spread alarm patterns to detect coincidence between the actual alarm pattern and either one of the forecast alarm patterns. Thus, it is possible to locate the fault even when the fault is spread over the lower layers.

More particularly, let the forecast spread alarm pattern appearing at an i-th point be $XP(i)$. Under the circumstances, it is readily understood that all of the forecast spread alarm patterns can be given by:

$$XP(0), \\ XP(1), \\ \vdots \\ XP(i), \\ \vdots \\ XP(I), \tag{1}$$

and are stored in a memory.

For example, if the first through the ninth communication units $a_1$ to $a_9$ are numbered in the manner illustrated in FIG. 1 and are assigned with a least significant bit (first bit) to a most significant bit (ninth bit), respectively, the forecast spread alarm patterns $XP(i)$ are given by:

$$XP(1) = 111111111, \\ XP(2) = 000111010, \\ XP(3) = 111000100, \\ XP(4) = 000001000, \\ XP(5) = 000010000, \\ XP(6) = 000100000, \\ XP(7) = 001000000, \\ XP(8) = 010000000, \text{ and} \\ XP(9) = 100000000. \tag{2}$$

When a fault occurs at a certain point or a faulty communication unit, it is possible to locate the fault or to specify the faulty communication unit by searching for a communication unit $a_k$ which satisfies Equation (2) given by:

$$AP = XP(k). \tag{3}$$

In order to specify the faulty communication unit $a_k$ in the above-mentioned manner, the acutal alarm pattern should be successively compared with the forecast spread alarm patterns stored in the memory to detect a specific forecast spread alarm pattern coincident with the actual alarm pattern. For example, let the actual alarm pattern AP be equal to (111000100). In this case, such an actual alarm pattern is coincident with $XP(3)$. This shows that the third communication unit $a_3$ is faulty.

However, the conventional communication system has disadvantages as pointed out in the preamble of the instant specification.

Principles of the Invention

Figure 2:
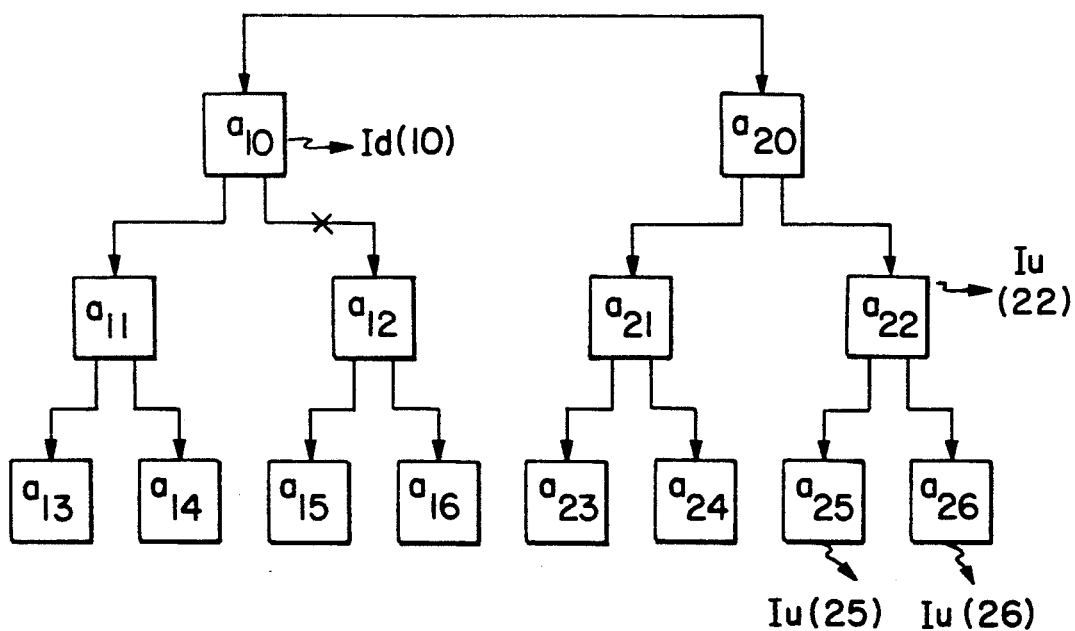
FIG. 2 is a block diagram of a communication network to which this invention is applicable.

Referring to FIG. 2, a communication network to which this invention is applicable is divided into first and second blocks communicable to each other and has a hierarchy divisible into an uppermost layer, a lower layer, and a lowermost layer. In the first block, the uppermost layer is composed of a zeroth communication unit $a_{10}$ while the lower layer is composed of first and second communication units $a_{11}$ and $a_{12}$. In addition, the lowermost layer is composed of third through sixth communication units $a_{13}$ through sixth units $a_{16}$.

Likewise, the uppermost layer of the second block is composed of a zeroth communication unit $a_{20}$ while the lower and the lowermost layers are composed of first and second communication units $a_{21}$ and $a_{22}$ and third through sixth units $a_{23}$ to $a_{26}$.

It may be said that the zeroth communication unit $a_{10}$ of the first block corresponds to the zeroth communication unit $a_{20}$ of the second block and that an i-th communication unit $a_{1i}$ of the first block likewise corresponds to an i-th communication unit $a_{2i}$ of the second block. A relationship between the i-th communication units $a_{1i}$ and $a_{2i}$ will be referred to as an opposite or a counterpart relationship hereinafter.

In FIG. 2, let unidirectional communication be carried out from the first block to the second block. Specifically, the third communication unit $a_{13}$ of the first block is assumed to communicate with the third communication unit $a_{23}$ that may be called a counterpart communication unit of the third communication unit $a_{13}$. In this event, the third communication unit $a_{13}$ supplies the first communication unit $a_{11}$ with an output signal. The output signal is multiplexed by the first communication unit $a_{11}$ into a first multiplexed signal together with an output signal sent from the fourth communication unit $a_{14}$. The first multiplexed signal is sent to the zeroth communication unit $a_{10}$ to be multiplexed into a second multiplexed signal together with an output signal fed from the second communication unit $a_{12}$.

In the second block, the second multiplexed signal is demultiplexed by the zeroth communication unit $a_{20}$ into first and second demultiplexed signals that are delivered to the first and the second communication units $a_{21}$ and $a_{22}$, respectively. Thereafter, the first demultiplexed signal is further demultiplexed by the first communication unit $a_{21}$ into third and fourth demultiplexed signals which are fed to the third and the fourth communication units $a_{23}$ and $a_{24}$. Similarly, the second demultiplexed signal is demultiplexed by the second communication unit $a_{22}$ into fifth and sixth demultiplexed signals which are delivered to the fifth and the sixth communication units $a_{25}$ and $a_{26}$, respectively.

If the output signal of the third communication unit $a_{13}$ is sent to the third communication unit $a_{23}$ of the second block as the third demultiplexed signal, the third communication unit $a_{13}$ can communicate with the third communication unit $a_{23}$. This means that the third communication unit $a_{13}$ is logically connected to the third communication unit $a_{23}$ which is its counterpart communication unit.

In FIG. 2, let a fault take place between the second and the zeroth communication units $a_{12}$ and $a_{10}$ of the first block in the illustrated communication network, as symbolized by a crisscross in FIG. 2. In this event, an alarm signal appears at the zeroth communication unit $a_{10}$ of the first block in a manner to be described later in detail and similarly appears at the second, the fifth, and the sixth communication units $a_{22}$, $a_{25}$, and $a_{26}$ of the second block.

This shows that a fault of a certain point or communication unit is spread over the lower communication units due to multiplex operation of communication units and is never spread over the higher communication unit. Such a spread of the fault will be called repercussion of a fault hereinafter. Under the circumstances, it may be concluded that repercussion of a fault is ascribed to a communication unit which belongs to a highest layer among faulty communication units.

In addition, either an input signal or an output signal is interrupted in a faulty communication unit which produces an alarm signal and which has a counterpart communication unit. Accordingly, it is possible to locate a fault by searching for an interruption point of a signal between the faulty communication unit and the counterpart communication unit.

Figure 3:
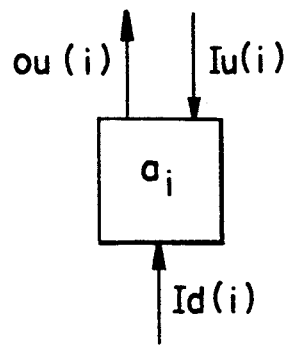
FIG. 3 is a block diagram of a communication unit for use in describing the principles of this invention.

Referring to FIG. 3 in addition to FIG. 2, let a fault take place in an i-th communication unit $a_i$. In this case, an alarm signal is produced from the i-th communication unit $a_i$. Herein, it is to be noted that such alarm signals appear when the i-th communication unit $a_i$ is not supplied from a higher layer with an input signal and is not supplied from a lower layer with an input signal. In addition, an alarm signal also appears from the i-th communication unit $a_i$ when an output signal is not supplied from the i-th communication unit $a_i$ to the higher layer. At any rate, such alarm signals are classified into three species which are representative of the interruption of an input or an output signal. The alarm signal which appears upon the interruption of the input signal from the higher layer may be referred to as a first alarm signal $Iu(i)$ while the alarm signal which appears upon the interruption of the input signal from the lower layer may be referred to as a second alarm signal $Id(i)$. The alarm signal which appears upon the interruption of the output signal to the higher layer may be called a third alarm signal $Ou(i)$.

By investigating the first through the third alarm signals $Iu(i)$, $Id(i)$, and $Ou(i)$, it is possible to detect a relationship between an input signal and an output signal in a manner to be described later in detail.

Taking the above into consideration, the principles of this invention are based on the following facts.

1) A fault at a certain communication unit is spread over lower layers from a highest layer in the faulty communication units. In other words, the fault may be determined by an alarm signal which occurs at a communication unit of a highest layer in the hierarchy.

2) One-to-one communication which has a counterpart relationship is carried out between a pair of the communication units that corresponds to each other and that has units with an opposite or face-to-face relationship.

3) Alarm signals which occur at each communication unit are classified into the first through the third alarm signals, as mentioned before.

Now, a fault locating system according to this invention can locate a fault or detect a fault point in accordance with the principles of this invention composed of the following steps.

1) Among the faulty communication units which produce the first alarm signals $Iu(i)$, a highest one of the communication units in the hierarchy is detected as a specific communication unit or a first unit B. The second and the third alarm signals $Id(i)$ and $Ou(i)$ are not considered in this step.

2) Detection is made about a counterpart communication unit which is opposite to the specific communication unit (first unit) B and which may be depicted at A and which may be referred to as a second unit A.

3) Determination is made about an upper communication unit C which is physically connected upstream of the counterpart communication unit B and which may be called a third unit C.

4) Herein, let the second, the first, and the third communication units A, B, and C produce Ou(A), Iu(B), and Id(C), respectively. Such alarm signals are judged in accordance with a judgment rule which is stored in Table 1 to locate the fault.

Figure 4:
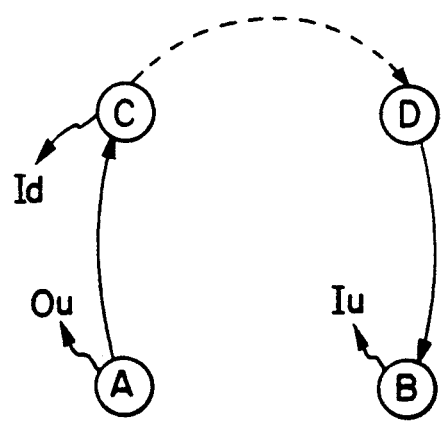
FIG. 4 is a block diagram of the communication network to which this invention is applicable.

Temporarily referring to FIG. 4, the judgment rule is determined in consideration of a communication network, as illustrated in FIG. 4. Specifically, an output signal is sent from the second or opposite communication unit A to the third or upper communication unit C and thereafter delivered through an additional communication unit D to the specific or first communication unit B. The judgment rule serves to locate a fault by monitoring a flow of the output signal in the illustrated communication network. In other words, fault detection is carried out by basically deriving three communication units from the communication units and by using the judgment rule.

TABLE 1

| Ou | Id | Iu | Results of Judgment |
|---|---|---|---|
| 0 | 0 | 0 | normal |
| 0 | 0 | 1 | fault between D and B (D → B) |
| 0 | 1 | 0 | fault of Id or Iu |
| 0 | 1 | 1 | fault between A and C (A → C) |
| 1 | 0 | 0 | error of Ou |
| 1 | 0 | 1 | error of Id |
| 1 | 1 | 0 | error of Iu |
| 1 | 1 | 1 | fault of A |

Thus, it is possible to locate the fault or to specify a fault point in the communication network by carrying out judgment in accordance with the above-mentioned judgment rule. In the above-mentioned judgment, the first unit B is determined in relation to the first alarm signal Iu(i).

Similar operation is carried out in relation to the third alarm signal Ou(i) in the following manner.

5) Selection is made about a highest communication unit (first unit) A that is located at a highest layer in faulty communication units producing the third alarm signals Ou(i). The first and the second alarm signals Iu(i) and Id(i) are omitted in this procedure.

6) Determination is made regarding a counterpart communication unit (second unit) B which has the counterpart relationship relative to the highest communication unit (first unit) A.

7) An upper communication unit (third unit) C is determined which is physically connected upstream of the highest communication unit A.

8) Let the first, the second, and the third units A, B, and C produce the third alarm signal Ou(A), the first alarm signal Iu(B), and the second alarm signal Id(C) which appear as a combination of alarm signals. Under the circumstances, Table 1 is referenced by the combination of the alarm signals to locate the fault.

More particularly, it is assumed in FIG. 2 that the fault takes place between the second communication unit $a_{12}$ and the zeroth communication unit $a_{10}$ of the first block, as exemplified before. In this event, it is readily understood that the zeroth communication unit $a_{10}$ and the second communication unit $a_{22}$ produce the second alarm signal Id(10) and the first alarm signal Iu(22), respectively. In addition, the fifth and the sixth communication units $a_{25}$ and $a_{26}$ produce the first alarm signals Iu(25) and Iu(26), respectively. The communication units $a_{10}$, $a_{12}$, $a_{22}$, $a_{25}$, and $a_{26}$ may be called faulty communication units.

In this situation, a highest communication unit is determined as the first unit B in accordance with the above-mentioned step 1) from the faulty communication units which produce the first alarm signals Iu(i). As a result, the second communication unit $a_{22}$ is determined as the specific communication unit (first unit) B. Subsequently, the second communication unit $a_{12}$ is decided as the second unit A to the first unit B. The third unit C is thereafter determined in relation to the second unit A. In the example being illustrated, the zeroth communication unit $a_{10}$ is physically connected upstream of the second communication unit $a_{12}$ and is therefore decided as the third unit C.

The first alarm signal Iu(22), the third alarm signal Ou(12), and the second alarm signal Id(10) are detected in connection with the second communication unit $a_{22}$, the second communication unit $a_{12}$, and the zeroth communication unit $a_{10}$, respectively. In the illustrated example, the first alarm signal Iu(22), the third alarm signal Ou(12), and the second alarm signal Id(10) are equal to 1, 0, and 1, respectively. The combination pattern of Ou(12)=0, Id(10)=1, and Iu(22)=1 is compared with each pattern memorized in Table 1. As a result, it is possible to locate the fault, namely, to detect that the fault takes place between A and C.

In FIG. 2, it is surmised that the unidirectional communication is carried out from the first block to the second block. However, this invention is applicable not only to bidirectional communication without changing classification of the alarm signals, the judging procedure, and the judgement rule but also to a wide variety of hierarchies.

First Embodiment

Figure 5:
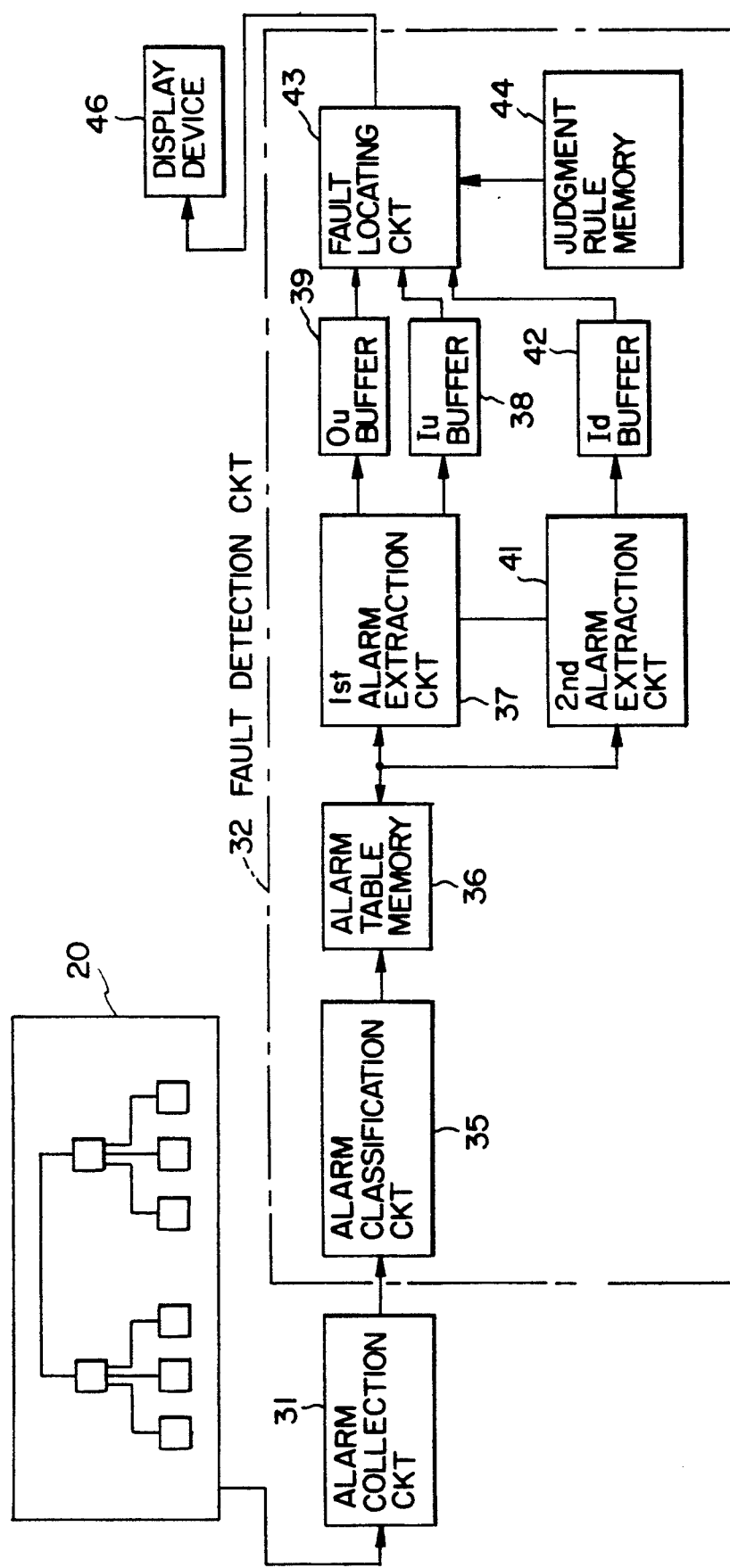
FIG. 5 is a block diagram of a fault locating system according to a first embodiment of this invention.

Referring to FIG. 5, a fault locating system according to a first embodiment of this invention is for use in combination with a communication network (depicted at 20) which has a hierarchy and which may be similar to that illustrated in FIG. 2. In FIG. 5, alarm signals are sent from communication units of the communication network 20 to the fault locating system. The fault locating system comprises an alarm collection circuit 31 for collecting alarm signals supplied from the communication network 20 to produce a sequence of output alarm signals and a fault detection circuit 32 successively supplied with the output alarm signals from the fault collection circuit 31 to detect or locate a fault in accordance with the above-mentioned principles.

The fault detection circuit 32 comprises an alarm classification circuit 35 supplied with the output alarm signals from the alarm collection circuit 31 to classify the output alarm signals into the first, the second, and the third alarm signals Iu(i), Id(i), and Ou(i) which belong to first, second, and third classes, respectively. The first, the second, and the third alarm signals Iu(i), Id(i), and Ou(i) are stored into an alarm table memory 36 in the form of Table 1 to be delivered to a highest layer alarm extraction circuit 37 which may be called a first alarm extraction circuit.

The highest layer alarm extraction circuit 37 is operable in first and second steps, as will become clear later.

In this event, the first alarm extraction circuit 37 accesses the alarm table memory 36 to search for the first alarm signals Iu representative of an interruption of an input signal sent from a higher layer. Subsequently, the first alarm extraction circuit 37 selects, as a first selected or extracted alarm signal Iu, the first alarm signal Iu given from the highest communication unit (first unit) B of the highest layer and additionally determines the highest communication unit B. In this state, the first alarm extraction circuit 37 sends the first selected alarm signal to a first buffer 38 which may be called an Iu buffer. Thus, the first selected alarm signal is stored in the Iu buffer 38.

When the highest communication unit B is determined, it is readily possible for the first alarm extraction circuit 37 to determine the counterpart communication unit (first unit) A and to know a state of the counterpart communication unit A by accessing the alarm table memory 36. Accordingly, the first alarm extraction circuit 37 reads the third alarm signal Ou of the counterpart communication unit out of the alarm table memory 36 and sends the third alarm signal Ou to a second buffer, namely, an Ou buffer 39 as a second selected or extracted alarm signal.

On the other hand, the alarm table memory 36 is also accessed by a second alarm extraction circuit 41 which is operable to extract, from the alarm table memory 36, the second alarm signal Id of the upper communication unit (third unit) C connected to the counterpart communication unit A. The second alarm signal Id extracted from the alarm table memory 36 is memorized into a third or an Id buffer 42 as a third selected or extracted alarm signal.

The first through the third selected alarm signals Iu, Ou, and Id are delivered from the Iu, the Ou, and the Id buffers 38, 39, and 42 to a fault locating circuit 43 which is coupled to a judgment rule memory 44. The fault locating circuit 43 judges or locates the fault from the first through the third selected alarm signals Iu, Ou, and Id in accordance with the judgment rule as mentioned before and supplies a display device 46 with a result signal representative of a result of judgment in the fault locating circuit 43.

Likewise, the first alarm extraction circuit 37 accesses the alarm table memory 36 again to extract, from the alarm table memory 36, the third alarm signals Ou representative of an interruption of an output signal to an upper or higher layer. The first alarm extraction circuit 37 determines a highest communication unit (first unit) A from the communication units which produce the third alarm signals Ou on one hand. In addition, the third alarm signal Ou sent from the highest communication unit (first unit) A is stored as a first additional selected alarm signal into the Ou buffer 39. Furthermore, the first alarm extraction circuit 37 extracts, from the alarm table memory 36, the first alarm signal of a counterpart communication unit (second unit) B opposite to the highest communication unit (first unit) A and stored the first alarm signal as a second additional selected alarm signal.

Similarly, the second alarm extraction circuit 41 accesses the alarm table memory 36 to extract the second alarm signal Id of an upper communication unit (third unit) C connected to the highest communication unit (first unit) A. The second alarm signal Id is stored as a third additional selected alarm signal into the Id buffer 42.

Thereafter, the first through the third additional selected alarm signals are sent to the fault locating circuit 43. The fault locating circuit 43 judges a point of a fault or locates the fault in accordance with the judgment rule stored in the judgment rule memory 44 and supplies the display device 46 with an additional result signal representative of a result of judgment.

The result signal and the additional result signal are collectively displayed on the display device 46.

Although the above description has thus far been made on the assumption that the fault detection circuit 32 is structured by hardware, operation of the fault detection circuit 32 can be accomplished by the use of a microcomputer operable in accordance with software.

Figure 6:
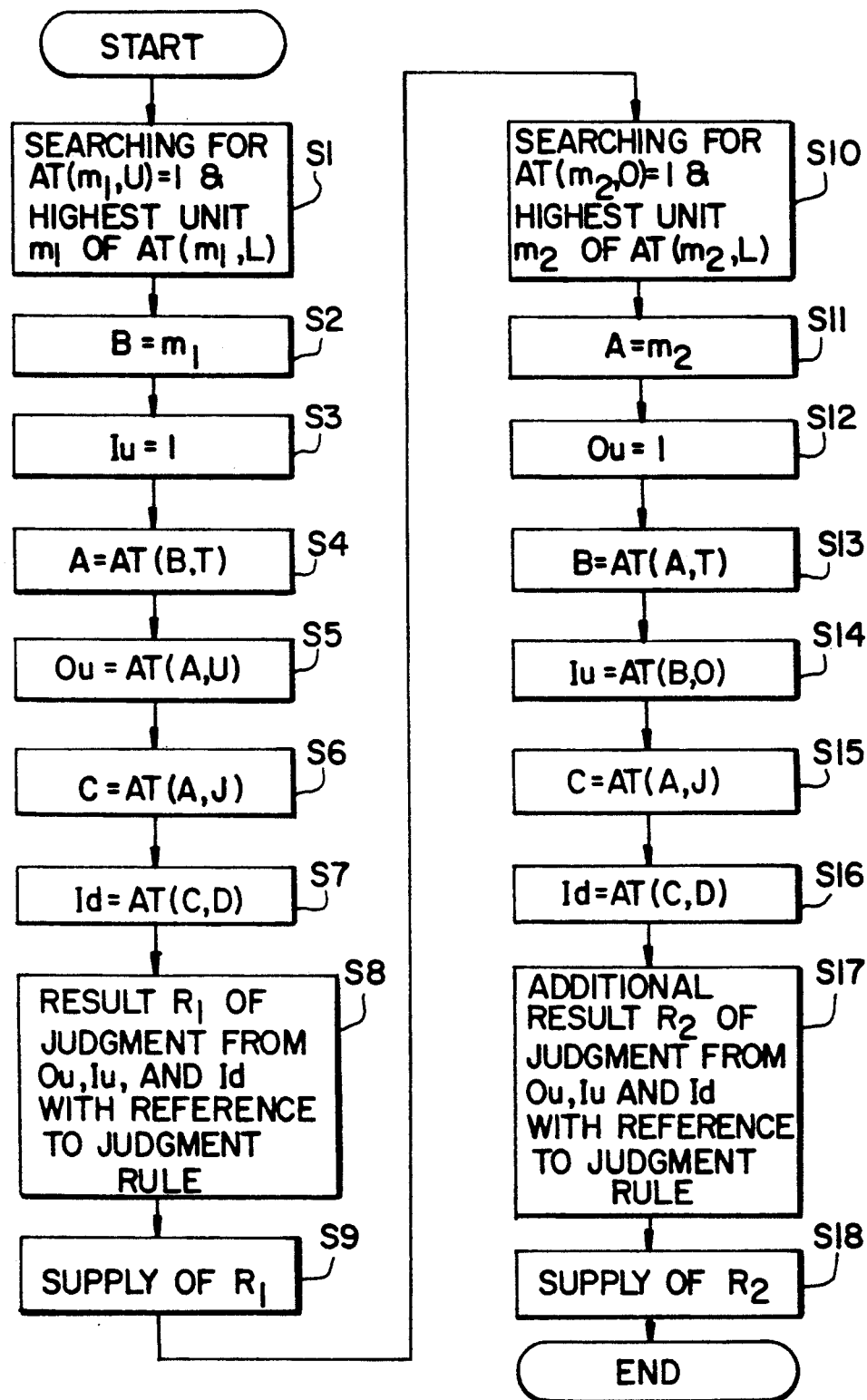
FIG. 6 is a flow chart for use in describing operation of the fault locating system according to the first embodiment of this invention.

Referring to FIG. 6, a program is shown in the form of a flow chart so as to accomplish operation of the fault detection circuit 32 by the use of a microcomputer.

In order to carry out the operation mentioned in conjunction with the fault detection circuit 32 illustrated in FIG. 5, the alarm table memory 36 memorizes Table 2 instead of Table 1. Herein, it is assumed that the communication units of the communication network 20 are identified by unit identification numbers m inherent to the respective communication units and have opposite communication units specified by opposite unit numbers T and upper communication units specified by upper unit numbers J. In addition, each communication unit belongs to one of the layers in the hierarchy. Taking the above into consideration, Table 2 memorizes the unit identification numbers m, the opposite or counterpart unit numbers T, the upper unit numbers J, and the layer numbers L in the following manner. Moreover, the first through the third alarm signals Iu, Id, and Ou are also stored in Table 2 at every communication unit.

TABLE 2

| (m) | (T) | (J) | (L) | Ou (O) | Iu (U) | Id (D) |
|---|---|---|---|---|---|---|
| 1 | T1 | J1 | L1 | 1 | 0 | 0 |
| 2 | T2 | J2 | L2 | 0 | 0 | 0 |
| . | . | . | . | . | . | . |
| . | . | . | . | . | . | . |
| . | . | . | . | . | . | . |

Thus, Table 2 has a two-dimensional arrangement. This shows that when a selected one of m, T, J, and L is indicated, the remaining ones of m, T, J, and L can be read out of Table 2. For example, when the unit identification number 1 is indicated as an indication parameter, the corresponding layer number L can be read out of Table 2 as a readout parameter. In this connection, two parameters, such as m, T, J, L, of Table 2, are simply represented by AT(x, y), where the preceding parameter x represents an indication parameter and the following parameter Y represents a readout parameter.

At any rate, the alarm table memory 36 is loaded with Table 2 through the alarm collection circuit 31.

Now, let the first alarm signal Iu or U take the logic "1" level at the highest communication unit that has the unit identification number $m_1$ in FIG. 6 and that belongs to the highest layer among the faulty communication units. Under the circumstances, the operation is started and proceeds to a first step S1 to detect the faulty communication units which produce the first alarm signals U of the logic "1" levels. Thus, detection is made at the first step S1 about the faulty communication units represented by $AT(m_1, U) = 1$. Subsequently, the highest communication unit $m_1$ is determined from the faulty communication units. Such determination is possible by searching for $AT(m_1, L)$ and detecting the highest layer L, as shown at the first step S1.

The highest communication unit $m_1$ is selected as the specific communication unit (first unit) B at a second step S2. At a third step S3, the first alarm signal Iu is set into the logic "1" level. The counterpart communication unit of the highest communication unit B is determined as the second unit A at a fourth step S4, as shown by $AT(B, T)$. Subsequently, the third alarm signal Ou of the second unit A is extracted at a fifth step S5.

At a sixth step S6, the upper communication unit C of the counterpart communication unit A is determined as the third unit C, as shown by $C = AT(A, J)$. The second alarm signal Id or D of the upper communication unit C is detected at a seventh step S7, as illustrated by $Id = AT(C, D)$. Subsequently, a combination of the alarm signals Ou, Iu, and Id is judged at an eighth step S8 with reference to the judgment rule memorized in the judgment rule memory 44 illustrated in FIG. 5 to obtain a result R1 of judgment. The result R1 of judgment is supplied to a display device at a ninth step S9.

Thereafter, the ninth step S9 is followed by a tenth step S10 to detect the faulty communication units which produce the third alarm signals Ou and the unit identification numbers of the faulty communication units, as shown by $AT(m_2, O)$. In addition, the highest communication unit $m_2$ is determined from the faulty communication units, as symbolized by $AT(m_2, L)$. The highest communication unit $m_2$ is determined as the first unit A at an eleventh step S11. As shown at a twelth step S12, the third alarm signal Ou is set into the logic "1" level. The counterpart communication unit of the highest communication unit A is determined as the second unit B at a thirteenth step S13, as shown by $B = AT(A, T)$. The first alarm signal Iu in the counterpart communication unit B is detected at a fourteenth step S14 which is followed by a fifteenth step S15 to determine an upper communication unit or third unit C, as shown by $C = AT(A, J)$. The second alarm signal Id of the upper communication unit C is detected at a sixteenth step S16, as symbolized by $Id = AT(C, D)$.

At a seventeenth step S17, a combination of Ou, Iu, and Id is judged with reference to the judgement rule to obtain an additional result of judgement and to supply the additional result to the display device at an eighteenth step S18. Thereafter, processing is completed.

Modified Principles of the Invention

Herein, consideration will be made about multiple faults which appear when a plurality of faults take place at a plurality of points or communication units. For this purpose, after a fault is at first located at a highest layer among faulty communication units, as mentioned before, an erasure is made about alarm signals which result from the fault as an influence of repercussion of the fault. In this case, alarm signals might be left as remaining alarm signals without being erased. Subsequently, a fault is again located and erased as regards such remaining alarm signals. Similar operation is successively carried out until the remaining alarm signals are all erased. To erase the faults resulting from repercussion will be called an alarm erasure hereinunder. At any rate, it is possible to locate all of multiple faults by searching for fault locations and by carrying out the alarm erasure until all the alarm signals are erased.

Practically, such operation will be executed through the following steps.

1) Among the, communication units which produce the first alarm signals Iu(i), detection is made to identify a highest communication unit B that belongs to a highest layer. The second and the third alarm signals Id(i) and Ou(i) are excluded during this step. The first through the third alarm signals Tu(i), Id(i), and Ou(i) may be collectively called a fault information signal.

2) A counterpart communication unit A is detected which is located at a counterpart of the highest communication unit B. The counterpart and the highest communication units A and B will be referred to as first and second units A and B, respectively, as mentioned before.

3) An upper communication unit is detected which is physically located upwards of the counterpart communication unit A and which may be called a third unit C.

4) Alarm signals which are produced by the counterpart, the highest, and the upper communication units A, B, and C are detected as Ou(A), Iu(B), and Id(C), respectively. Such an alarm pattern is compared with contents of Table 3 to locate a fault or to specify a fault location. Thus, Table 3 defines a judgment rule for locating a fault like Table 1.

TABLE 3

|   | Ou | Id | Iu | Results of Judgment | Execution of Erasure |
|---|----|----|----|---------------------|---------------------|
| 0 | 0  | 0  | 0  | normal              | 0 |
| 1 | 0  | 0  | 1  | fault between D and B | 1 |
| 2 | 0  | 1  | 0  | error of Id         | 0 |
| 3 | 0  | 1  | 1  | fault between A and C | 1 |
| 4 | 1  | 0  | 0  | error of Ou         | 0 |
| 5 | 1  | 0  | 0  | error of Id         | 1 |
| 6 | 1  | 1  | 0  | error of Iu         | 1 |
| 7 | 1  | 1  | 1  | fault of A          | 1 |

5) The alarm signals Ou(A), Iu(B), and Id(C) which are produced from the counterpart, the highest, and the upper communication units A, B, and C are erased.

6) On occurrence of the fault in the highest communication unit B, all of alarm signals Iu(i) which occur at the communication units located downwards of the highest communication unit B are also erased.

7) When remaining alarm signal or signals Iu(i) are left in the remaining communication units, operation is returned back to the first step 1) and the first through the sixth steps 1) to 6) are thereafter repeated until all of the alarm signals Iu(i) are erased.

8) Among faulty communication units which produce the third alarm signals Ou(i), a highest communication unit (first unit) A is detected which belongs to a highest layer in the faulty communication units. During this step, the first and the second alarm signals Iu(i) and Id(i) are neglected.

9) A counterpart communication unit B is detected which is a counterpart of the highest communication unit A.

10) An upper communication unit (third unit) C is detected which is physically connected upwards of the highest communication unit A.

11) Alarm signals which are produced by the highest, the counterpart, and the upper communication units A, B, and C are detected as Ou(A), Iu(B), and Id(C), respectively. Subsequently, a fault is located in accordance with the judgement rule shown in Table 3.

12) The alarm signals Ou(A), Iu(B), and Id(C) which are produced by A, B, and C are erased.

13) When the communication units which produce the third alarm signals Ou(i) are left, operation is returned back to the eighth step 8) and the eighth through the twelfth steps 8) to 12) are repeated until all the third alarm signals Ou(i) are erased.

14) Among faulty communication units which produce the second alarm signals Id(i), a highest communication unit (first unit) C is detected which belongs to a highest layer C in the faulty communication units. In this case, the first and the third alarm signals Iu(i) and Ou(i) are neglected.

15) A lower communication unit (second unit) A is detected which is physically connected downwards of the highest communication unit C.

16) A counterpart communication unit (third unit) B is detected which is opposite to the lower communication unit A.

17) Alarm signals which are produced by the lower, the counterpart, and the highest communication units A, B, and C are detected as Ou(A), Iu(B), and Id(C). A fault is located by the use of the above-mentioned alarm signals in accordance with the judgement rule shown in Table 3.

18) The alarm signals Ou(A), Iu(B), and Id(C) which are produced by the lower, the counterpart, and the highest communication units A, B, and C are erased.

19) In the presence of the communication units which produce the third alarm signals Id(i), operation is returned back to the fourteenth step 14) and the fourteenth through the eighteenth steps 14) to 18) are repeated until all of the third alarm signals Id(i) are erased.

20) When all the alarm signals Ou, Iu, and Id are extinct, the above-mentioned judging operation is finished.

Herein, the judgement rule shown in Table 3 is basically applicable to the communication network illustrated in FIG. 4. More specifically, the illustrated network comprises first and second communication units A and B which are logically located at counterpart positions relative to each other, namely, opposite to each other. In addition, the network comprises third and fourth communication units C and D physically connected upwards of the first and the second communication units A and B, respectively. Thus, the judgment rule is for judging a fault from a signal which flows through the first through the fourth communication units A, B, C, and D. To this end, four communication units are selected from the communication network. Thereafter, the judgment rule is applied to the selected communication units so as to locate or judge a fault through the above-mentioned procedure or steps. After judgment of the fault, determination is made regarding whether or not alarm signals are to be erased which are produced in lower communication units located downwards of the second communication unit B. In Table 3, when the execution of erasure takes the logic "1" level, the erasure is practically executed. Otherwise, the erasure is not executed.

Referring back to FIG. 2, the above-mentioned procedure will be specifically described so as to facilitate an understanding of the modified principles of this invention. In FIG. 2, it is assumed again that a fault takes place between the second and the zeroth communication units $a_{12}$ and $a_{10}$ of the first block. In this event, the alarm signals are produced from the zeroth communication unit $a_{10}$ and the second, the fifth, and the sixth communication units $a_{22}$, $a_{25}$, and $a_{26}$, as illustrated in FIG. 2. In addition, it is assumed that a fault appears at the third communication unit $a_{23}$ as a result of the multiple faults.

a) Under the circumstances, a highest communication unit $a_{22}$ which belongs to a highest layer among the communication units which produce the first alarm signals Iu(i) is at first determined as the second unit B.

b) The second communication unit $a_{12}$ which is a counterpart of the second communication unit $a_{22}$ is determined as the first unit A.

c) The upper communication unit $a_{10}$ which is connected upwards of the second communication unit $a_{12}$ is determined as the third unit C.

d) The third, the second, and the first alarm signals Ou, Id, and Iu are detected from the first, the second, and the third units A, B, and C, namely, the second communication unit $a_{12}$, the zeroth communication unit $a_{10}$, and the second communication unit $a_{22}$, respectively. As a result, the third, the second, and the first alarm signals Ou, Id, and Iu are given by:

$$Ou = Ou(12) = 0,$$

$$Id = Id(10) = 1, \text{ and}$$

$$Iu = Iu(22) = 1.$$

According to Table 3, the above combination (011) of Ou, Id, and Iu specifies a fault between the first and the third units A and C. In other words, it is possible to specify the fault between the zeroth and the second communication units $a_{10}$ and $a_{12}$.

e) Thereafter, the second and the first alarm signals Id(10) and Iu(22) are erased which are used for judging the fault during the step d).

f) According to the judgement rule shown in Table 1, it is possible to execute an erasure in connection with the combination of the alarm signals (011). Therefore, an erasure is made about the alarm signals Iu(25) and Iu(26) which appear downwards of the second unit B, namely, the second communication unit $a_{22}$.

g) The second unit B is again determined by selecting a next highest communication of a next highest layer from the communication units which produce the remaining alarm signals Iu. In this case, the second unit B is the third communication unit $a_{23}$.

h) The first unit A is determined by detecting the third communication unit $a_{13}$ which is opposite to the second unit B, namely, the third communication unit $a_{23}$ and may be called a counterpart unit or an opposite unit.

i) The third unit C is determined by selecting an upper communication unit which is physically connected upwards of the third communication unit $a_{13}$, namely, the first unit A.

j) The alarm signals produced by the third communication unit $a_{13}$, the first communication unit $a_{11}$, and the third communication unit $a_{23}$ are represented by:

$$Ou = Ou(13) = 0,$$

$$Id = Id(11) = 0, \text{ and}$$

$$Iu = Iu(23) = 1.$$

A combination or pattern of the alarm signals (001) is compared with the contents of Table 3 and is judged in accordance with the judgment rule determined by Table 3. As a result, it is judged that a fault takes place between the fourth and the third units D and C. Namely, the fault appears at a point between the first and the third communication units $a_{21}$ and $a_{23}$.

k) The first alarm signal Iu(23) is erased which is used for judging the fault. In this example, since no remaining alarm signal is left in the communication network, judgment is finished.

Although description has been made only about a unidirectional communication network, it is possible to locate a fault or faults in a bidirectional communication network also, as mentioned before.

In addition, the judgment rule shown in Table 1 may be modified into another judgment rule known in the art.

Various kinds of methods may be used to erase an alarm signal or signals and may be, for example, a method which is described in a paper No. 1791 contributed to National Conference 1987 of the Institute of Electronics, Information, and Communication Engineers in Japan and wherein erasing patterns are previously memorized in correspondence to fault points.

Second Embodiment

Figure 7:
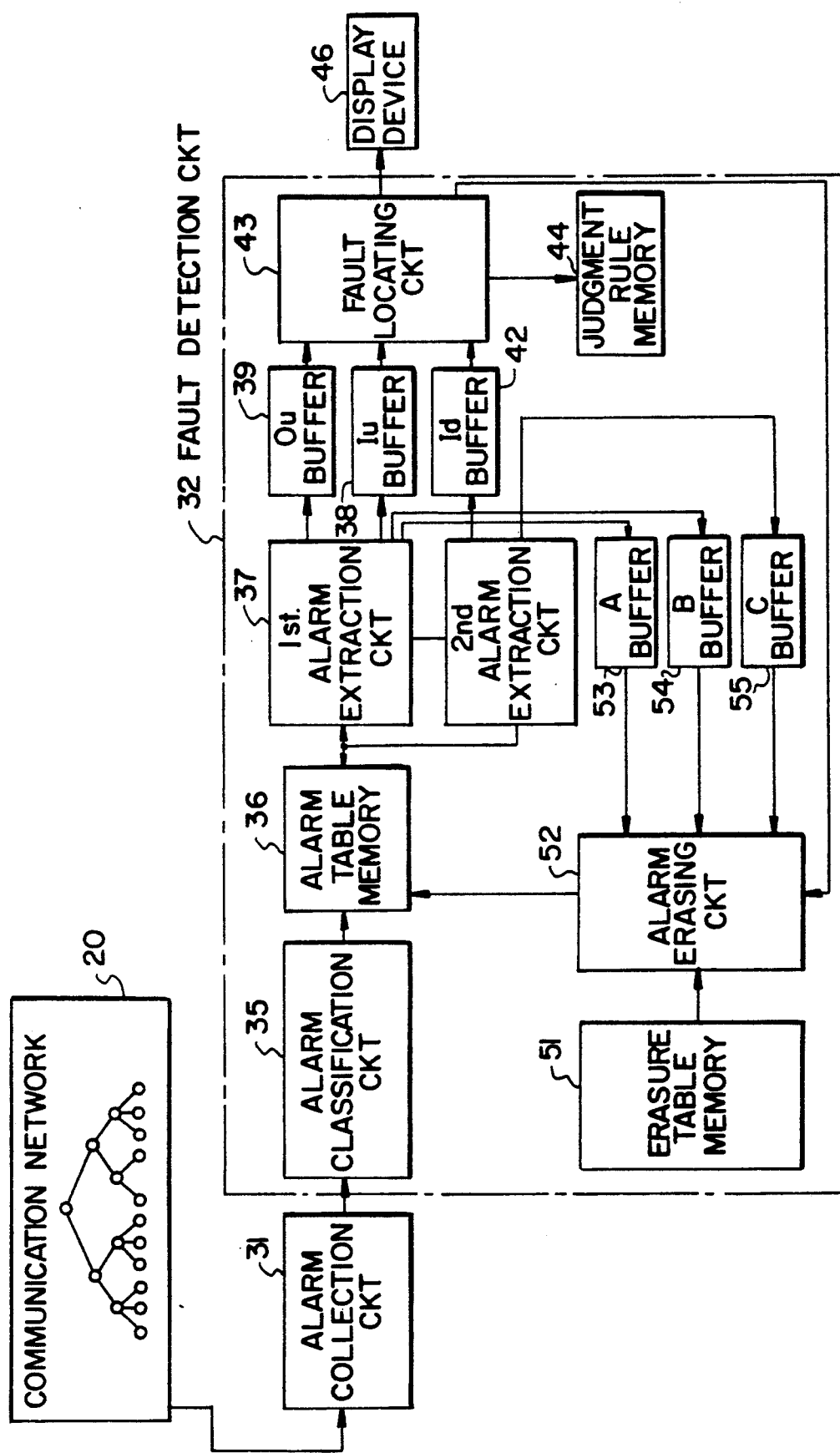
FIG. 7 is a block diagram of a fault locating system according to a second embodiment of this invention.

Referring to FIG. 7, a fault locating system according to a second embodiment of this invention is for use in combination with a hierarchical communication network 20 like in FIG. 5 and is similar in structure to that illustrated in FIG. 5 except that the fault locating system illustrated in FIG. 7 comprises an erasure table memory 51, an alarm erasing circuit 52, an A buffer 53, a B buffer 54, and a C buffer 55, all of which will be described later in detail and which may be collectively called an erasing circuit for erasing alarm signals memorized in the alarm table memory 36.

The hierarchical communication network 20 supplies the alarm collection circuit 31 with a fault information signal which is produced by each communication unit, like in FIG. 5 and which is composed of the alarm signals as mentioned above. The alarm signals are sent as output alarm signals from the alarm collection circuit 31 to the fault detection circuit 32. In the alarm detection circuit 32, the output alarm signals are received by the alarm classification circuit 35 to be classified into the first, the second, and the third alarm signals Iu(i), Id(i), and Ou(i). The first, the second, and the third alarm signals Iu(i), Id(i), and Ou(i) are stored in the alarm table memory 36 in the manner illustrated in Table 2.

As mentioned in conjunction with FIG. 5, the first alarm extraction circuit 37 accesses the alarm table memory 36 to search for the second unit B at the first step 1). The second unit B is present in the highest layer and indicates the highest communication unit within the communication units which produce the first alarm signals Iu(i), as described before. A unit identification number m of the second unit B is memorized into the B buffer 53. From this fact, it is readily understood that the B buffer 53 is for storing an alarm signal for the second unit B. On the other hand, the first alarm signal Iu is stored in the Iu buffer 38 under control of the first alarm extraction circuit 37.

Furthermore, the first alarm extraction circuit 37 carries out the second step 2) to extract, from the alarm table memory 36, the unit identification number of the first unit A and the third alarm signal Ou. The first unit A is representative of the opposite or counterpart communication unit. The first alarm extraction circuit 37 is operated so that the unit identification number of the first unit A is delivered to the A buffer 53 to be stored therein while the third alarm signal Ou of the first unit A is delivered to the Iu buffer 38 to be stored therein.

Likewise, the second alarm extraction circuit 41 accesses the alarm table memory 36 at the third step 3) to extract the unit identification number of the third unit C and the third alarm signal Id of the third unit C from the alarm table memory 36. The third unit C is representative of the upper communication unit physically connected upwards of the first unit A, as described in conjunction with the third step 3). The unit identification number and the second alarm signal Id of the third unit C are sent from the second alarm extraction circuit 41 to the C buffer 55 and the Id buffer 42 to be stored therein, respectively.

When the Ou, the Iu, and the Id buffers 39, 38, and 42 are loaded with the third alarm signal Ou, the first alarm signal Iu, and the second alarm signal Id, respectively, the fault locating circuit 43 accesses the judgment rule memory 44 at the fourth step 4). The fault locating circuit 43 judges a fault from a combination or pattern of the alarm signals in accordance with the judgment rule to locate the fault. A result R1 of judgment is supplied from the fault locating circuit 43 to the display unit 46 to be displayed on it. Thus, a fault point is displayed on the display unit 46.

After the result of judgment is supplied to the display unit 46, the A, the B, and the C buffers 53, 54, and 55 supply the unit identification numbers of the first, the second, and the third units A, B, and C to the alarm erasing circuit 52. Supplied with the unit identification numbers of the first through the third units A to C, the alarm erasing circuit 52 accesses the alarm table memory 36 to erase the third alarm signal Ou(A), the first alarm signal Iu(B), and the second alarm signal Id(C) which are stored in the alarm table memory 36, respectively.

On the other hand, when the fault locating circuit 43 detects additional fault or faults which result from repercussion of the above fault, the fault locating circuit 43 supplies the alarm erasing circuit 52 with a request to erase the additional fault or faults. Responsive to the request, the alarm erasing circuit 52 accesses the erasure table memory 51 which stores an erasure table as shown in Table 4.

TABLE 4

| Identification Number | Number of Units to be erased | Unit Number to be erased |     |     |     |     |
| --- | --- | --- | --- | --- | --- | --- |
| 1 | E1 | 11 | 12 | 13 | ... | 1E1 |
| 2 | E2 | 21 | 22 | 23 | ... | 2E2 |
| . | . | . | . | . | . | . |
| . | . | . | . | . | . | . |

The alarm erasing circuit 52 sends the unit identification number to retrieve the erasure table memory 51. As shown in Table 4, the erasure table memory 51 stores the number E1 of the communication units to be erased and the unit identification numbers to be erased. In other words, the number E1 of the communication units is representative of the number of the alarm signals resulting from the fault. For example, when the unit identification number m is 1, an erasure is made about the alarm signals memorized for the communication units which are equal in number to E1 and which have the unit identification numbers 11, 12, 13, . . . .

In general, the unit identification numbers to be erased in connection with the second unit B are given by:

$$ET(B, i), [2 \leq i \leq ET(B, 1)],$$

where ET specifies the erasure table having a two-dimensional arrangement.

Subsequently, the first alarm extraction circuit 37 accesses the alarm table memory 36 again to search for the second unit B which is located at a highest layer within the communication units which produce the first alarm signals Iu. When such a communication unit producing the first alarm signal Iu is found, operation is successively repeated until no first alarm signal exists.

When the first alarm signal does not exist, the first alarm extraction circuit 37 proceeds to a next procedure. Specifically, the first alarm extraction circuit 37 accesses the alarm table memory 36 like in the preceding procedure to detect a highest communication unit, namely, the first unit A in the communication units which produce the third alarm signals Ou. This step corresponds to the eighth step 8) mentioned before. On detection of the first unit A, the unit identification number and the third alarm signal Ou of the first unit A are stored in the A buffer 53 and the Ou buffer 39, respectively. Next, the counterpart or opposite unit of the first unit A is detected as the second unit B that has the unit identification number and the first alarm signal Iu. The unit identification number and the first alarm signal Iu of the second unit B are stored in the B buffer 54 and the Iu buffer 38, respectively.

Likewise, the second alarm extraction circuit 41 accesses the alarm table memory 36 to detect an upper communication unit which is connected upwards of the first unit A and which may be referred to as the third unit C which has the unit identification number and the second alarm signal Id. The unit identification number and the second alarm signal Id of the third unit C are stored in the C buffer 55 and the Id buffer 42, respectively.

When the Ou, the Iu, and the Id buffers 39, 38, and 42 are loaded with the third alarm signal Ou, the first alarm signal Iu, and the second alarm signal Id, the fault locating circuit 43 accesses the judgment rule memory 44 to read the judgment rule out of the judgment rule memory 44, like in the preceding procedure. In accordance with the judgment rule, the fault locating circuit 43 judges a fault from a pattern of the alarm signals Ou, Iu, and Id to locate the fault and to supply the display unit 46 with an additional result R2 of judgment.

Subsequently, the first alarm extraction circuit 37 accesses the alarm table memory 36 to search for a highest communication unit in the faulty communication units which produce the third alarm signals Ou. When such a highest communication unit is found, the above-mentioned procedure is successively repeated until no third alarm signal is found. Otherwise, the operation is finished.

It is possible to accomplish the operation of the fault detection circuit 32 of FIG. 7 by the use of a computer program.

Figure 8:
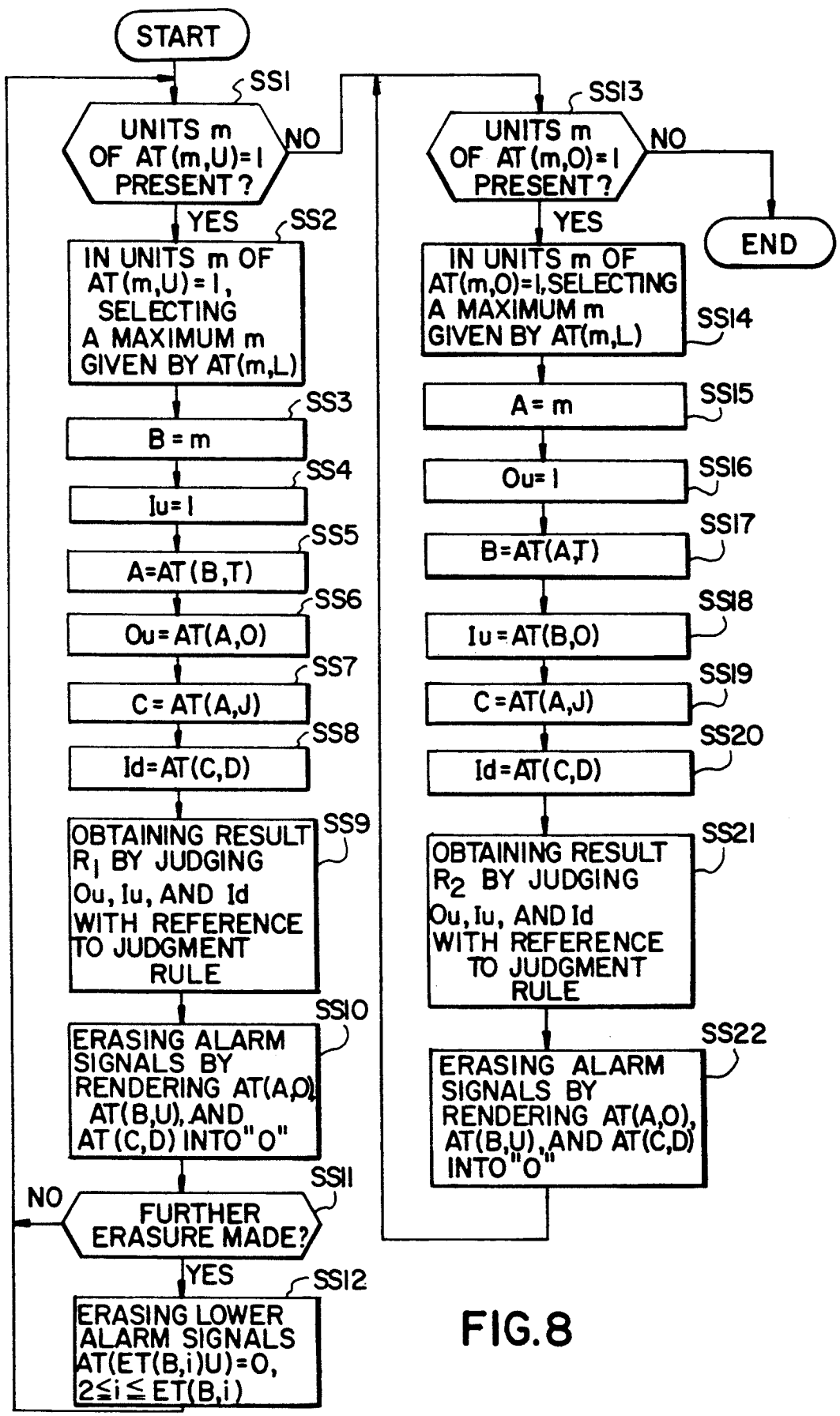
FIG. 8 is a flow chart for use in describing operation of the fault locating system according to the second embodiment of this invention.

Referring to FIG. 8, a flow chart is shown which carries out the operation of the fault detection circuit 32 illustrated in FIG. 7. In FIG. 8, the alarm table symbolized at AT in FIG. 8 is retrieved at a first stage SS1 so as to detect presence or absence of faulty communication units m which satisfy $AT(m, U) = 1$ as a result of occurrence of the first alarm signals Iu.

Subsequently, the first stage SS1 is followed by a second stage SS2 at which a maximum number m of the communication units is selected from the faulty communication units satisfying $At(m, U) = 1$ and is given by searching for $AT(m, L)$. In other words, the second unit B is selected at the second stage SS2 as a highest communication unit that is specified by the faulty communication unit which belongs to a highest layer. Thus, the highest communication unit m is determined as the second unit B at a third stage SS3 while the first alarm signal Iu of the second unit B is rendered into the logic "1" at a fourth stage SS4.

At a fifth step SS5, a counterpart unit number T of the second unit B is read out of the alarm table as illustrated in Table 2 and is defined as the first unit A, as symbolized at $A = AT(B, T)$. Thereafter, the third alarm signal Ou of the first unit A is read out of the alarm table at a sixth stage SS6, as symbolized by $Ou = AT(A, O)$.

An upper communication unit number J of the first unit A is read out of the alarm table and is determined as the third unit C at a seventh stage SS7, as symbolized at $C = AT(A, J)$. The second alarm signal Id of the third unit C is detected at an eighth stage SS8, as shown by $C = AT(C, D)$.

Thus, the third, the first, and the second alarm signals Ou, Iu, and Id are obtained during the fourth through the eighth stages SS4 to SS8 and take the logic "1" level or the logic "0" level which may be called an alarm signal value.

At a ninth stage SS9, the alarm signal values of the alarm signals Ou, Iu, and Id are judged with reference to the judgment rule to obtain the result R1 of judgment. The ninth stage SS9 proceeds to a tenth stage SS9 at which an erasure is made about the alarm signals used in the ninth stage SS9. In this event, the third alarm signal Ou of the first unit A, the first alarm signal Iu of the second unit B, and the second alarm signal Id of the third unit C are rendered into the logic "0" levels, as shown by $AT(A, O) = 0$, $AT(B, U) = 0$, and $AT(C, D) = 0$.

After erasure of the above-mentioned alarm signals, an eleventh stage SS11 is carried out to detect whether or not a further erasure is to be made as regards lower communication units. To this end, the erasure table ET as shown in Table 4 is accessed to read the number of the communication units and the unit identification numbers.

When no alarm signal is left to be erased, the eleventh stage SS11 is returned back to the first stage SS1. Otherwise, the alarm signals produced in the lower communication units are erased at a twelfth stage SS12, as symbolized by $AT[ET(B, i)U]$, $[2 \leq i \leq ET(B, i)]$. The twelfth stage SS12 is followed by the first stage SS1.

When no first alarm signal is found in the first stage SS1, a thirteenth stage SS13 follows the first stage SS1 to carry out operation in connection with the third alarm signals Ou. At the thirteenth stage SS13, the alarm table is retrieved to detect presence or absence of faulty communication units m which produce the third alarm signals Ou of the logic "1" levels.

If such faulty communication units are detected at the thirteenth stage SS13, a highest communication unit m is selected at a fourteenth stage SS14 from the faulty communication units detected at the thirteenth stage SS13 and is located in a highest layer in the faulty communication units. The fourteenth stage SS14 can be executed by accessing the alarm table AT to detect a highest communication unit m which is located at a highest layer in the faulty communication units, as symbolized at AT(m, L) in FIG. 8.

The highest communication unit is determined as the first unit A at a fifteenth stage SS15 while the third alarm signal Ou of the first unit A is put into the logic "1" level at a sixteenth stage SS16. At a seventeenth stage SS17, the counterpart or opposite communication unit T of the first unit A is read out of the alarm table and is determined as the second unit B.

Thereafter, the first alarm signal Iu of the second unit B is read out of the alarm table at an eighteenth stage SS18 while the upper communication unit number J of the first unit A is read out of the alarm table to be defined as the third unit C at a nineteenth stage SS19.

At a twentieth stage SS20, the second alarm signal Id of the third unit C is read out of the alarm table. Thus, the third alarm signal Ou of the first unit A, the first alarm signal Iu of the second unit B, and the second alarm signal Id of the third unit C are obtained by accessing the alarm table.

Under the circumstances, the above-mentioned alarm signals are judged at a twenty-first stage by the use of the judgment rule read out of the judgment rule memory to obtain an additional result R2 of judgment, like at the ninth stage SS9. Thereafter, the remaining alarm signals produced in lower communication units are erased at a twenty-second stage SS22 like at the twelfth stage SS12.

The above-description is not made about the fourteenth through the nineteenth steps 14) to 19) which carry out operation on the basis of the second alarm signal Id. This is because the second alarm signal Id left after the first and the third alarm signals Iu and Ou are processed can be uniquely located in connection with the communication unit or units.

While this invention has thus far been described in conjunction with a few embodiments thereof, it will readily be possible for those skilled in the art to put this invention into practice in various other manners. For example, an opposite or a counterpart communication unit of a highest communication unit may be logically determined when both the highest and the counterpart communication units belong to the same layer.

What is claimed is:

1. A fault locating system for use in combination with a communication network which comprises a plurality of communication units structured in a hierarchy and divisible into a plurality of layers graded from an uppermost layer to a lowermost one, said fault locating system used to locate a fault when said fault occurs in said communication network, wherein each of said communication units, when there is no fault, is supplied with first and second input signals from upper and lower ones of said layers in the hierarchy, respectively, and supplies an output signal upwards of the hierarchy, said communication units producing fault information signals representative of whether or not the faults occur in said communication units and being rendered into faulty communication units on occurrence of the faults, each of said fault information signals being classifiable into first, second, and third alarm signals, said first and second alarm signals representing interruptions of said first and second input signals while said third alarm signal represents an interruption of said output signal, said fault locating system comprising:

classification means supplied with said fault information signals from said communication units for classifying each of said fault information signals into said first through said third alarm signals;

alarm signal memorizing means connected to said classification means for storing said first through said third alarm signals for every one of said communication units;

judgment rule memorizing means for memorizing a predetermined judgment rule for locating the fault;

alarm monitoring means connected to said alarm signal memorizing means for monitoring said alarm signal memorizing means to detect whether or not the first through the third alarm signals are stored in said alarm signal memorizing means and to output the first through the third alarm signals as first through third extracted signals when the first through third alarm signals are stored wherein, the first extracted signal is a selected one of the first and the third alarm signals sent from a first unit that is a highest one of the faulty communication units located at a highest layer among the faulty communication units, while the second extracted signal is a remaining one of the first and the third alarm signals sent from a second unit that logically forms a counterpart communication unit of said first unit in the hierarchy, and said third extracted signal is the second alarm signal of a third unit that belongs to a physically higher layer relative to said first and said second units; and judging means connected to said alarm monitoring means and said judgment rule memorizing means for judging the fault from said first through said third extracted signals in accordance with said predetermined judgment rule to locate the fault.

2. A fault locating system as claimed in claim 1, said third unit being physically connected to said second unit, wherein said first extracted signal is formed by the first alarm signal of the first unit while said second extracted signal is formed by the third alarm signal of the second unit, and the third extracted signal is formed by the second alarm signal of the third unit.

3. A fault locating system as claimed in claim 1, said third unit being physically connected to said second unit, wherein the first extracted signal is formed by the third alarm signal extracted from the first unit while the second and the third extracted signals are formed by the first and the second alarm signals extracted from said second and said third units, respectively.

4. A fault locating system as claimed in claim 1, wherein said alarm monitoring means comprises:

first extracting means connected to said alarm signal memorizing means for extracting, as the first and the second extracted signals, the first and the third alarm signals sent from the first and the second units; and second extracting means connected to said alarm signal memorizing means for extracting, as the third extracted signal, the second alarm signal sent from the third unit.

5. A fault locating system as claimed in claim 1, said fault being located in connection with a selected one of said faulty communication units and spread over the other communication units except said selected one of the faulty communication units, further comprising:

erasing means connected to said alarm monitoring means and to said alarm signal memorizing means for erasing, from said alarm signal memorizing means, the first through the third alarm signals concerned with said selected one of the faulty communication units together with the fault information signals concerned with the other communication units influenced by said fault.

6. A method of locating a fault in a communication network which comprises a plurality of communication units structured in hierarchy and divisible into a plurality of layers graded from an uppermost layer to a lowermost one, said method being carried out to locate a fault when said fault occurs in said communication network, each of said communication units, when there is no fault, receiving first and second input signals from upper and lower ones of said layers in the hierarchy, respectively, and supplying an output signal upwards of the hierarchy, said communication units producing fault information signals representative of whether or not the faults occur in said communication units and being rendered into faulty communication units on occurrence of the faults, each of said fault information signals being classifiable into first, second, and third alarm signals, said first and said second alarm signals representing interruptions of said first and said second input signals while said third alarm signal represents an interruption of said output signal, said method comprising the steps of:

classifying each of said fault information signals into said first through said third alarm signals;

memorizing said first through said third alarm signals for every one of said communication units in an alarm signal memory;

memorizing a predetermined judgement rule for locating the fault;

accessing said alarm signal memory on occurrence of the fault to extract first, second, and third extracted signals from said alarm signal memory wherein, the first extracted signal is one of the first and the third alarm signal sent from a first unit that is a highest one of the faulty communication units located at a highest one of the layer among the faulty communication units while the second extracted signal is a remaining one of the first and the third alarm signals sent from a second unit that logically forms a counterpart communication unit of said first unit in the hierarchy, and said third extracted signal is the second alarm signal of a third unit that belongs to a physically higher layer relative to said first and said second units; and judging the fault from said first through said third extracted signals in accordance with said predetermined judgement rule to locate the fault.

7. A method as claimed in claim 6, said fault being located in connection with a selected one of said faulty communication units and spread over the other communication units except said selected one of the faulty communication units, further comprising after the judging step the step of:

erasing, from said alarm signal memory, the first through the third alarm signals concerned with said selected one of the faulty communication units together with the fault information signals concerned with the other communication units influenced by said fault.

* * * * *